United States Patent [19]

Kleinknecht

[11] 4,422,763
[45] Dec. 27, 1983

[54] AUTOMATIC PHOTOMASK ALIGNMENT SYSTEM FOR PROJECTION PRINTING

[75] Inventor: Hans P. Kleinknecht, Bergdietikon, Switzerland

[73] Assignee: RCA Corporation, New York, N.Y.

[21] Appl. No.: 382,424

[22] Filed: May 27, 1982

Related U.S. Application Data

[63] Continuation-in-part of Ser. No. 967,785, Dec. 8, 1978, abandoned.

[51] Int. Cl.$^3$ .................... G01B 11/26; G01B 9/02
[52] U.S. Cl. .................................. 356/356; 356/400
[58] Field of Search ............... 356/356, 399–401; 250/237 R

[56] References Cited

U.S. PATENT DOCUMENTS

| | | | |
|---|---|---|---|
| 3,542,469 | 11/1970 | Hennings et al. | 355/46 |
| 3,718,396 | 2/1973 | Hennings | 355/43 |
| 3,853,398 | 12/1974 | Kano | 355/43 |
| 4,025,197 | 5/1977 | Thompson | 356/111 |
| 4,037,969 | 7/1977 | Feldman et al. | 356/172 |
| 4,052,603 | 10/1977 | Karlson | 356/400 |
| 4,153,371 | 5/1979 | Koizumi et al. | 356/400 |
| 4,200,395 | 4/1982 | Smith et al. | 356/356 |
| 4,211,489 | 7/1980 | Kleinknecht et al. | 356/400 |
| 4,251,160 | 2/1981 | Bouwhuis et al. | 356/401 |

FOREIGN PATENT DOCUMENTS 52-154369 12/1977 Japan .

Primary Examiner—William H. Punter
Attorney, Agent, or Firm—Birgit E. Morris; Donald S. Cohen; Joseph D. Lazar

[57] ABSTRACT

An automatic photomask alignment system for projection printing includes a monochromatic light source, such as a laser, a series of diffraction patterns which are located on a semiconductor wafer in locations where alignments are to be made, at least one key which is located on a photomask with which the wafer is to be aligned, and a projection lens system. A light beam from the monochromatic light source is directed about the key on the photomask and through the projection lens system onto one of the diffraction patterns on the substrate to provide a pattern of light spots whose intensities at various locations are determined by the relative alignment of the key and the diffraction grating. A step and repeat mechanism is used to move the semiconductor wafer relative to the image of the photomask pattern which is projected onto the wafer while a feedback arrangement, which employs photocells and servo motors for aligning the locations where devices are to be formed on the substrate relative to the photomask, provides the alignment of the projected image with the proper locations for their formation.

12 Claims, 10 Drawing Figures

AUTOMATIC PHOTOMASK ALIGNMENT SYSTEM FOR PROJECTION PRINTING

The application is a continuation-in-part of application Ser. No. 967,785 filed Dec. 8, 1978, and now abandoned.

The present invention relates to an alignment system for automatically aligning photomasks used in projection printing apparatus to manufacture semiconductor devices.

As used herein, the term "semiconductor device" is intended to include both a discrete device and an integrated circuit. In the manufacture of semiconductor devices, a number of photolithography steps are involved. Heretofore, many of these steps were accomplished by proximity printing of photomasks, each intended to define one level of the semiconductor device.

In order to increase the yield of semiconductor devices and to extend the life of photomasks, projection printing methods have been proposed. In such systems, a single photomask is used in a step and repeat mechanism which exposes a number of areas with the same pattern on each semiconductor substrate. Because of the use of projection equipment, there is no contact between the photomask and the semiconductor substrate. Accordingly, the photomask will not be damaged by contact with the substrate. Also, the photomask may be made a number of times larger than the intended image on the substrate which facilitates its production. The actual number of exposures stepped and repeated across a particular substrate is dependent upon the size of the mask, the magnification in the projection process, and the size of the substrate. Thus, it is easier to make a photomask which is free of defects than would be possible where a large number of patterns are manufactured on a single photomask. In addition, the photomask remains free of defects of the type introduced by contact between it and the surface of the substrate.

A problem which has heretofore existed with respect to projection printing is that a large number of extremely accurate alignments, corresponding to the number of exposures required on the substrate, must be made for each photomask used. For example, there may be 100 or more exposures made on a single semiconductor substrate. Accordingly, each photomask is stepped and repeated for projection 100 or more times, and each of the images must be aligned with the portions of the devices which had previously been formed. As a result of the numerous, highly accurate, alignments which are required, manual alignment would be prohibitively time consuming. Accordingly, automatic alignment devices have heretofore been proposed for projection printing apparatus. In particular, an article entitled "Phillips Develops Mask Projection System with Alignment Accuracy to 0.1 Micrometer" in *Electronics*, May 12, 1977, pages 32–33 describes one such system. However, greater alignment accuracies and faster alignments than were heretofore available are required.

IN THE DRAWING

Figure 1:
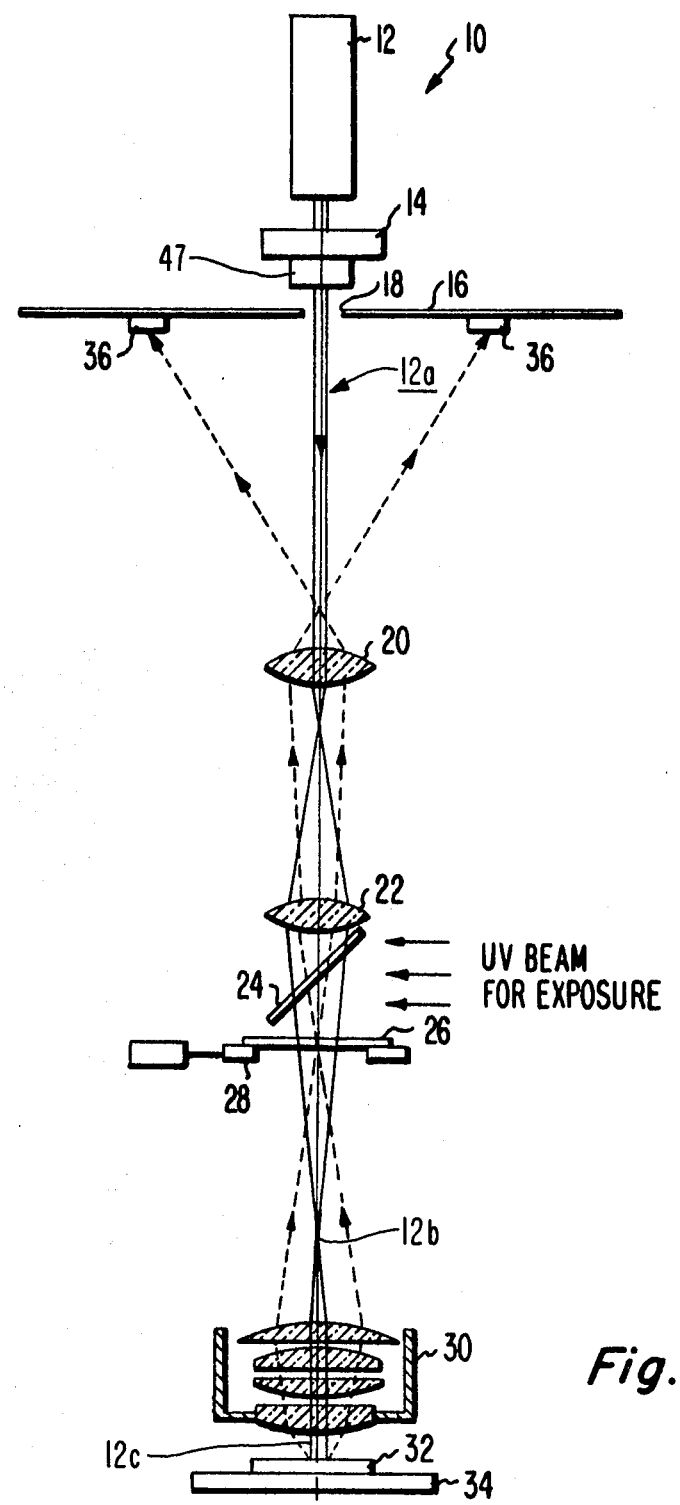
FIG. 1 illustrates a side cross-sectional view of the automatic alignment apparatus of the present invention.

Referring to FIG. 1, the automatic photomask alignment apparatus 10 is shown. The photomask alignment apparatus 10 comprises a monochromatic light source, such as a laser 12 which may be a helium neon laser, such as Spectra Physics Model 120 having a power output of 5 mW and a wavelength of 0.6328 μm. That wavelength is particularly suitable because photoresists presently used in semiconductor manufacturing processes are not sensitive to that wavelength, so the photoresist is not exposed during the alignment process. The apparatus 10 includes a light chopper 14, such as Princeton Applied Research Model 125A which has an aperture wheel 47 providing a chopping rate of 1600 Hz. Adjacent to the light chopper 14 is a screen 16 having an opening 18 formed therein through which the laser beam is directed. In the preferred embodiment of the invention, the opening 18 has a diameter of about 5 mm.

The alignment apparatus 10 further comprises an alignment lens system which is used to focus the beam from the laser 12 over a key on a photomask, as will be more fully explained hereinafter. The alignment lens system is also used to focus the diffracted light produced when the laser beam strikes a selected diffraction pattern on a semiconductor wafer during the alignment process as will also be explained hereinafter. In the preferred embodiment of the invention, the alignment lens system is comprised of a first lens 20, such as an Olympus 10X microscope objective having a focal length of about 16 mm and an aperture of f/2 and a second lens 22 such as an EL-Nikkor objective having a focal length of 150 mm and an aperture of f/5.6.

The automatic alignment apparatus 10 further comprises means for allowing either an exposure beam or a laser beam to be directed through a photomask. In the preferred embodiment of the invention, the means is an interference mirror 24 which allows the laser beam and its diffracted back-reflected beams to pass through it while also providing means for projecting an exposure light, such as an ultraviolet beam, through a photomask 26. If the interference mirror 24 is used, it must act as a mirror for the wavelength used for exposure of the photoresist and be at least partially transparent to the wavelength of the laser 12 used for photomask alignment. It is possible to replace the interference mirror 24 either by a solid mirror with holes of sufficient diameter formed therein to allow the laser beams to go through or to have a mechanically operated mirror which would move into position either for alignment or exposure. However, mechanical movement of a large mirror would probably be inefficient for an alignment system of the type desired herein.

In the preferred embodiment of the invention, a photomask 26 is mounted on a movable photomask mounting stage 28 containing servo motors adapted to move the photomask 26 in the x and y direction.

Finally, a projection lens 30 such as an EL-Nikkor objective having a focal length of 63 mm and an aperture of f/3.5 is used to produce an image of the photomask on a semiconductor wafer 32. The magnification of the projection lens 30 determines the ratio between the size of the pattern on the photomask 26 and the size of the projected image on the wafer 32. In the preferred embodiment of the invention, the projection lens 30 is a 10:1 reduction lens.

The optical system thus comprises (1) the pair of focusing lenses 20 and 22 for illuminating the key 52 located on the photomask 26, and (2) the projection lens 30 positioned between the photomask 26 and the wafer 32 to illuminate the wafer surface with the light beam 12a from laser 12. The laser beam 12a as seen in FIG. 1 is focused by lens 20 and lens 22 at a point 12b above the projection lens 30 and thence passed by lens 30 to illuminate the surface of wafer 32. Focusing point 12b is preferably positioned at the focal point of lens 30 as will be apparent to those skilled in this art to develop a substantially collimated light beam 12c to more uniformly illuminate the surface of wafer 12. The laser beam 12c on reflection from the portion of the diffraction pattern 42 on the wafer 32 that has not been masked by the illuminated key 52, will be diffracted into one or more diffraction beams which are then, in turn, focused by projection lens 30 and focusing lenses 20 and 22 as spots on the photodiodes 36, as will be now further described in detail.

The semiconductor wafer 32 is mounted on a step and repeat stage 34. In the preferred embodiment of the invention, four photosensitive elements, such as photodiodes 36 (only two of which appear in the plane of FIG. 1) are mounted on the surface of the screen 16 which is away from the chopper 14. The photodiodes 36 may be type DT40 manufactured by EG&G which are silicon PIN diodes having an active area of about 13 mm$^2$. Error signals from the diodes 36 are used to drive the servo motors in the photomask mounting stage 28 to move the photomask 26 relative to the semiconductor wafer 32 in order to reduce the error signal, as would be obvious to those of ordinary skill in the art. All of the apparatus described should be mounted on a firm support, such as an optical table (not shown) in order to isolate the apparatus from vibrations which would effect the alignment procedures.

Figure 2:
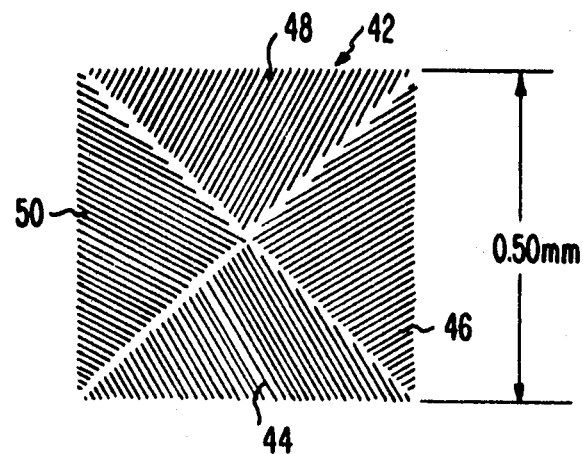
FIG. 2 is a top view of a diffraction pattern of the type employed with the present invention.

FIG. 2 illustrates the preferred embodiment of a diffraction pattern 42 which is used in conjunction with the present invention. The form of the diffraction pattern employed is not critical to the invention. However, a pattern which provides x and y information in the form of diffraction gratings must be used, and the pattern 42 has been found to be acceptable for that purpose. The pattern 42 comprises a square with an edge dimension of about 0.50 mm which is divided into four sections 44, 46, 48 and 50 by the diagonals of the square. Each of the sections 44, 46, 48, 50 comprises a diffraction grating whose lines are oriented at a particular angle chosen so that both x-axis and y-axis information is available from the pattern 42. In the preferred embodiment of the diffraction pattern 42 the periodicity of each diffraction grating is 10 microns. The diffraction pattern 42 may be formed on a semiconductor wafer, such as the wafer 32, in a number of different ways. For example, the diffraction gratings may be made up of a defined photoresist in one step of the process of manufacturing semiconductor devices and may be made up of a defined oxide layer, such as a silicon dioxide layer, a defined semiconductor layer, or a defined metal layer in other steps of the process. Accordingly, it is only important to the invention that the diffraction pattern 42 be present on or in the wafer to the extent that the desired diffraction pattern 42 will provide spots in the proper locations when the pattern 42 is illuminated by the laser 12. The specific makeup of the diffraction pattern 42, other than the layout of its gratings 44, 46, 48, 50 is unimportant.

Figure 3:
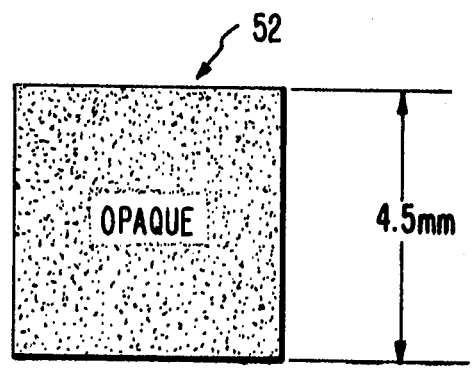
FIG. 3 is a top view of an opaque key which would be used on a photomask employed in conjunction with the diffraction pattern of FIG. 2.

An opaque key 52, shown stippled in FIG. 3, is part of the photomask 26. In the preferred embodiment of the invention, the key 52 comprises an opaque square having an edge length of about 4.5 mm in order that the projected image of the key 52 will have an edge length of about 0.45 mm. If a projection lens 30 having a different magnification ratio than the 10:1 reduction of the lens used in the preferred embodiment of the invention were to be employed, the edge length of the key 52 would have to be adjusted to correspond. The exact shape of either the diffraction pattern 42 or the key 52 is unimportant to the present invention as long as their shapes are compatible with one another as will be understood by those of ordinary skill in the art. For example, by changing the size or shape of the key 52 relative to the size or shape of the pattern 42, the sensitivity of the apparatus 10 is affected, and the relationship of the output signals of the diodes 36 to the displacement of the key 52 with respect to the pattern 42 is determined.

Figure 4:
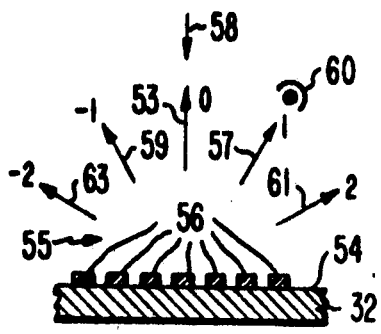
FIG. 4 is a side view of the light pattern which is produced by a laser beam which illuminates the diffraction grating.

Referring now to FIG. 4, a cross section of a portion of the wafer 32 is shown. On the upper surface 54 of the wafer 32 a portion of a diffraction pattern comprised of diffraction grating 55 is shown. By way of example, the grating 55 may be comprised of defined lines of photoresist 56 over the surface 54 of the wafer 32, which may be made of silicon. A laser beam (represented schematically by a downward pointing arrow 58) illuminates the surface 54 of the wafer 32 as well as the diffraction pattern 55 comprised of the photoresist lines 56. A light pattern whose rays are called "orders" is produced by the reflection of the laser beam 58 from the surface 54 with the specific light pattern being a function of the periodicity of the grating 55. In particular, there will be a zero order beam 53 which is produced normal to the surface 54, a first order beam 57 and a negative first order beam 59 produced at a first angle to the zero order beam, a second order beam 61 and a negative second order beam 63 produced at a second angle to the zero order beam, and so on. The position of any of the beams is determined by the periodicity of the diffraction pattern 55. Accordingly, a photodiode 60 may be placed in a location corresponding to where the first order beam 57 is directed in order to measure the intensity of the first order beam. The intensity of higher order beams will be related to the intensity of the first order beam, so it is sufficient for the purpose of this invention to measure the intensity of any desired beam. Accordingly, the invention will be described with reference hereinafter to the measurement of the intensity of the first order beam. However, one skilled in the art will recognize that a higher order beam or a negative order beam may be used without departing from the spirit or scope of the invention.

Figure 5:
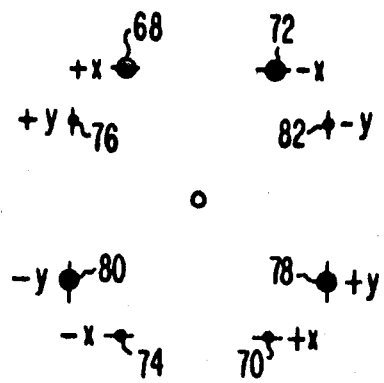
FIG. 5 is the light pattern which would be seen in a plane parallel to the plane in the diffraction pattern shown in FIG. 2 if that diffraction pattern was illuminated by a laser.

Referring now to FIG. 5, the light pattern of the first order beams which appear in a plane parallel to and result from the diffraction pattern shown in FIG. 2 is shown. There are two light spots 68, 70 corresponding to the first order beams diffracted from grating 46 of pattern 42 of FIG. 2, two light spots 72, 74 corresponding to the first order beams diffracted from grating 50, two light spots 76, 78 corresponding to the first order beams diffracted from grating 48, and two light spots 80, 82 corresponding to the first order beams diffracted from grating 44. The intensity of illumination of either of the spots 68, 70 will be the same at any time as will be the intensity of illumination of any other pair of spots which arise from the diffraction from any given grating 50, 44, 46, 48. When the key 52 shown in FIG. 3 is centrally located over the diffraction pattern 42 of FIG. 2, the intensity of illumination of either of the spots 68, 70 will be equal to the intensity of illumination of either of the spots 72, 74. It will be appreciated that if the key 52 is centrally located over the diffraction pattern 42, according to this embodiment, only the peripheral portions (about 0.05 mm in width) of the pattern 42 will be illuminated by the laser beam passed around the key 52. These portions are enough to provide the diffracted beams needed to align the photomask 26 over the wafer 32. Similarly, the intensity of illumination of either of the spots 76, 78 will be equivalent to the intensity of illumination of either of the spots 80, 82. The intensity of illumination of either of the spots 68, 70 will decrease as the key 52 is moved over the pattern 42 in the +x direction. Therefore, those spots 68, 70 will be referred to as the "+x" spots. Similarly, the spots 72, 74 will be referred to as the "−x" spots, the spots 76, 78 will be referred to as the "+y" spots, and the spots 80, 82 will be referred to as the "−y" spots. Accordingly, the intensity of illumination of either of the +x spots 68, 70 can be compared to the intensity of illumination of either of the −x spots 72, 74 in order to determine whether the key 52 is properly aligned over the diffraction pattern 42 with respect to movement along the x-axis. In the preferred embodiment of the invention, the comparison of the intensity of illumination is made by placing photodiodes 36 in the locations on the screen 16 corresponding to where the +x spot 68 and the −x spot 72 (shown circled in FIG. 5) are projected. Similarly, photodiodes 36 are placed at the locations on the screen 16 where the +y spot 78 and the −y spot 80 are focused in order to measure their relative intensities to determine the alignment of the key 52 with respect to the y-axis of the pattern 42. While a particular group of four spots was selected to provide x and y information in the preferred embodiment of the invention, it should be obvious to one skilled in the art that any other selection which includes at least one +x spot, at least one −x spot, at least one +y spot, and at least one −y spot would provide equivalent information.

While a single diffraction pattern 42 and a single key 52 are sufficient to determine whether the key 52 is centrally located over the diffraction pattern 42, a single pattern 42 and key 52 are insufficient to determine whether there has been any rotation of the photomask 26 with respect to the wafer 32. In view of the fact that such rotational information is critical to the proper alignment of the photomask 26 with the semiconductor wafer 32 in the manufacture of semiconductor devices, rotational information must also be provided.

Figure 6:
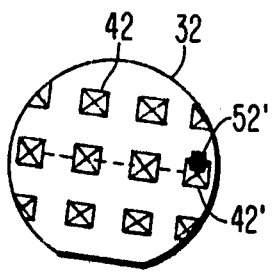
FIGS. 6A–6E are top views illustrating the rotational alignment of each photomask (after the first) with the wafer.
Figure 6:
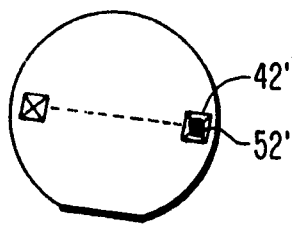
Figure 6:
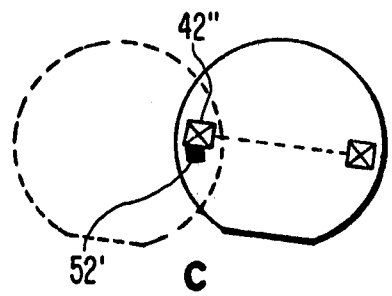
Figure 6:
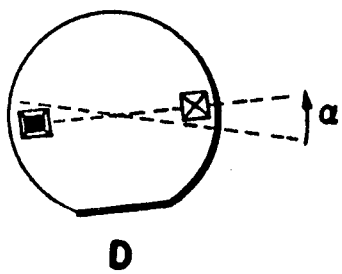
Figure 6:
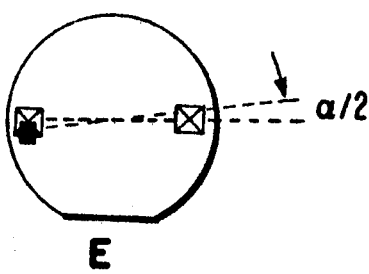

Referring now to FIG. 6, in order to accomplish the rotational alignment of the semiconductor wafer for each mask level after the first photomask is used, the step and repeat stage 34 upon which the wafer 32 is mounted is moved to the extreme left position such that the most extreme right hand pattern 42' is nearly in alignment with key image 52'. Then the automatic aligner is turned on (FIG. 6A). When the automatic aligner has brought the image 52' of the photomask key 52 into registration with the diffraction pattern 42' (FIG. 6B) the automatic aligner is turned off and the step and repeat stage is moved to the extreme right hand side such that the pattern 42'' is nearly in alignment with key image 52' (FIG. 6C). The step and repeat stage is then rotated until the key image 52' on the photomask 42 is properly aligned (FIG. 6D), at least in the y direction, with the pattern on the wafer 42. The amount of rotational motion, α, required to bring the wafer 42 into rotational alignment is recorded and the wafer 42 is then rotated back in the opposite direction by one-half that amount, α/2, thereby completing the rotational alignment of the wafer 42 (FIG. 6E).

At that point the step and repeat stage is moved to the first position and the automatic aligner is turned on. The sequence described above is repeated for each photomask 26 which is used, except that the first photomask which is used to form the original diffraction pattern on the wafer at each step and repeat location does not require any rotational information, as would be obvious to those skilled in the art.

What is claimed is:

1. An automatic projection printing apparatus for aligning a photomask with a semiconductor wafer comprising:
   (a) a semiconductor wafer having a plurality of diffraction patterns formed thereon;
   (b) a monochromatic light source adapted to have a beam directed onto a selected one of said diffraction patterns;
   (c) a key on said photomask, said key being adapted to block portions of said selected one of said diffraction patterns from said beam of said monochromatic light source;
   (d) at least four photosensitive elements adapted to receive light from said monochromatic light source after said beam has been reflected from said selected one of said diffraction patterns;
   (e) step and repeat stage means for mounting said semiconductor wafer such that said semiconductor wafer can be moved in discrete steps from one position to another, each of said positions containing one of said diffraction patterns;
   (f) mounting means for mounting said photomask whereby light from said monochromatic light source can be directed onto said key on said photomask and thereafter directed onto said selected one of said diffraction patterns formed on said semiconductor wafer;
   (g) feedback means including said photosensitive elements and said mounting means for aligning said photomask to a selected portion of said substrate by relative linear and rotational movement between said photomask and said substrate in response to the intensities of light detected by said photosensitive elements; and
   (h) optical means comprising a pair of focusing lenses positioned between said source and said photomask for illuminating said key and focusing the portion of said beam not blocked by said key to a location above said wafer, said optical means further comprising a projection lens positioned between said focus location and said wafer for projecting said beam from said focused location to the surface of said wafer,
   (i) said optical means and said feedback means being arranged to focus reflected and diffracted beams from said diffraction pattern on said photosensitive elements when said photomask is in alignment with said wafer.

2. The apparatus of claim 1 wherein said monochromatic light source comprises a laser.

3. The apparatus of claim 1 wherein said diffraction patterns are comprised of photoresist patterns formed on a semiconductor wafer.

4. The apparatus of claim 1 wherein said wafer comprises a silicon wafer and said diffraction patterns are comprised of a silicon dioxide pattern formed on said wafer.

5. The apparatus of claim 1 wherein said diffraction patterns comprise a series of diffraction gratings which provide x-axis and y-axis information regarding the relative alignment of said photomask and said wafer.

6. The apparatus of claim 1 wherein said key comprises an opaque pattern adapted to prevent light from said monochromatic light source from reaching a portion of said diffraction pattern.

7. The apparatus of claim 1 wherein said photosensitive elements comprise photodiodes.

8. The apparatus of claim 1 further comprising an exposure light adapted to have a beam therefrom directed through said photomask onto said position on said semiconductor wafer including said selected one of said diffraction patterns.

9. The apparatus of claim 8 further comprising means for directing said beam of said exposure light through said photomask.

10. The apparatus of claim 9 wherein said means for directing said exposure light comprises an interference mirror.

11. The apparatus of claim 1 wherein said projection lens optically reduces the size of the image on said photomask for projection onto said semiconductor wafer.

12. The apparatus of claim 1 wherein said photomask is illuminated by said beam at a portion thereof surrounding and comprising said key such that the periphery only of said diffraction pattern on said wafer is illuminated by said beam.

* * * * *